United States Patent [19]
Alpay et al.

[11] Patent Number: 5,459,002
[45] Date of Patent: * Oct. 17, 1995

[54] PHOTOMASK BLANKS

[75] Inventors: Hakki U. Alpay, Highland, N.Y.; Roger H. French; Franklin D. Kalk, both of Wilmington, Del.

[73] Assignee: E. I. Du Pont de Nemours and Company, Wilmington, Del.

[*] Notice: The portion of the term of this patent subsequent to May 16, 2012 has been disclaimed.

[21] Appl. No.: 218,144

[22] Filed: Mar. 28, 1994

Related U.S. Application Data

[63] Continuation of Ser. No. 976,782, Nov. 16, 1992, abandoned.

[51] Int. Cl.$^6$ .................................................. G03F 9/00
[52] U.S. Cl. ........................................ 430/5; 204/298.2
[58] Field of Search ................................ 430/5; 427/34

[56] References Cited

U.S. PATENT DOCUMENTS

| | | | |
|---|---|---|---|
| 4,415,262 | 11/1983 | Koyama et al. | 430/5 |
| 4,890,309 | 12/1989 | Smith et al. | 378/38 |
| 5,187,726 | 2/1993 | White | 378/35 |
| 5,230,971 | 7/1993 | Alpay | 430/5 |

FOREIGN PATENT DOCUMENTS

| | | | |
|---|---|---|---|
| 0203563 | 12/1986 | European Pat. Off. | |
| 2-242252 | 9/1990 | Japan | G03F 1/14 |
| 4-125643 | 4/1992 | Japan | G03F 1/14 |

OTHER PUBLICATIONS

B. J. Lin, Solid State Technology, pp. 43–47, Jan. 1992.

O. S. Heavens, "Optical Properties of Thin Solid Films", Dover Publications, NY, 1965, pp. 69–80.

"Si–N Attenuated Phase Shift Layer for Phase Shift Mask Application", *IBM Technical Disclosure Bulletin*, 35(3), 440–441, Aug. 1992.

Patent Abstract of Japan re Japanese Patent Publication No. JP4125643 (1992).

Patent Abstract of Japan re Japanese Patent Publication No. JP2242252 (1990).

*Primary Examiner*—Mark A. Chapman

[57] ABSTRACT

Transmissive embedded phase shifter-photomask blanks are disclosed which comprise an optically inhomogeneous attenuating film which has a transmission of at least 0.001 and consists essentially of a combination of a metallic component and a dielectric component. One surface of the film has a higher content of metallic component than the other surface and the profile of change in extinction coefficient is gradual through the film thickness. The profile of change in extinction coefficient and the film thickness are selected to provide a phase shift of about 180° (or an odd multiple thereof) at a selected wavelength.

8 Claims, 4 Drawing Sheets

PHOTOMASK BLANKS

This is a continuation of application Ser. No. 07/976,782 filed Nov. 16, 1992, now abandoned.

FIELD OF THE INVENTION

This invention relates to photomask blanks, and more particularly, to photomask blanks providing phase shift in incident light at a specified wavelength.

BACKGROUND OF THE INVENTION

Conventional photomask blanks commonly consist of a substrate, e.g., fused silica plate, on which is an opaque chrome film. Photomasks are produced from these blanks by providing a desired pattern of open areas in the film. In use, light is optically projected through the open areas of the photomask onto the surface of a light sensitive substrate, such as a photopolymer-coated semiconductor wafer. Currently, photomasks are illuminated with visible or ultraviolet light. A fundamental limitation of optical imaging is that line widths of the order of the wavelength of the illuminating light are diffraction limited. In other words, light having a wavelength of the same order of magnitude as the desired optical image will diffract, and the projected image will be wider than the desired image.

To allow for patterns narrower than the wavelength of visible or ultraviolet light to be produced, the art has considered changing to a shorter wavelength source, such as X-ray. U.S. Pat. No. 4,890,309 discloses a type of attenuated (as opposed to opaque) photomask, particularly useful in X-ray lithography, wherein the material and thickness of the attenuating film are selected to both pass (i.e., transmit) a fraction of the incident electromagnetic radiation and to phase shift the radiation relative to radiation passing through the open features of the mask. The materials of choice are homogeneous films of tungsten, gold, silver, alloys of these materials or alternating layers of high and low atomic number materials (e.g., tungsten and carbon).

In an effort to avoid the cost and complexity of X-ray lithography, a variety of phase-shifting photomasks have been developed for ultraviolet and visible light ranges (see, for example, B. J. Lin, SOLID STATE TECHNOLOGY, pp. 43–47, January, 1992). Among these are the rim phase-shifting photomask, which requires either substrate etching or the use of an additional phase-shifting layer. The rim phase-shifting photomask is inherently applicable to arbitrary mask patterns, but requires a large positive mask bias to reduce exposure times to a practical level and due to strong proximity effects it is difficult to delineate all feature sizes and shapes for an arbitrary mask pattern using one common exposure. An improvement over the rim phase-shifting photomask is known in the art as the attenuated phase-shifting photomask (APSPM). APSPMs employ an absorptive, partially transmitting, phase shifter in place of the conventional opaque chromium part of the patterned film. The transmission of the absorptive phase shifter is adjusted to less than about 0.20 to prevent creation of ghost lines. However, not all phase shifters can phase shift and absorb by the desired amount. Consequently, a multilayered structure consisting of materials of differing absorptive and phase shifting properties may be required in some cases. A commercially available APSPM utilizes a graded chromium oxycarbonitride composition film which varies from a Cr—N compound at the substrate-film interface to a Cr—O compound at the film-air interface, which also serves as an anti-reflective coating. While this APSPM provides a degree of phase shifting, a further procedure, such as reactive ion etching of the substrate, in this case, fused silica, is necessary to achieve the desired 180° phase shift.

SUMMARY OF THE INVENTION

This invention provides a transmissive embedded phase shifter-photomask blank (i.e., an EPS-PMB) for a selected wavelength which comprises an optically inhomogeneous attenuating film having a transmission of at least 0.001 and consisting essentially of a combination of a metallic component and a dielectric component; wherein one surface of the film has a higher content of metallic component than the other surface, and the profile of change in the extinction coefficient is gradual through the film thickness; and wherein said profile of change and the film thickness are selected to provide a phase shift of about 180° (or an odd multiple thereof) at the selected wavelength.

DETAILED DESCRIPTION OF THE INVENTION

Figure 1:
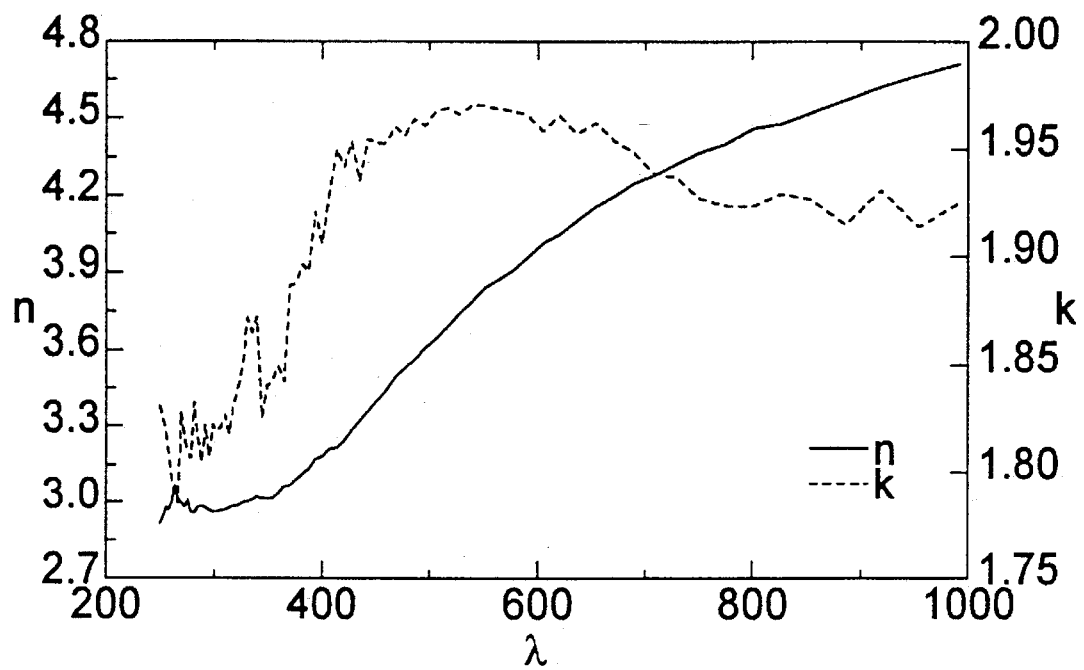
FIG. 1. Graph of the Index of Refraction (n) and Extinction Coefficient (k) as a function of wavelength ($\lambda$) in nanometers for a representative metallic material.

This invention provides an advantageous film for photomask blanks. The film provides a phase shift of about 180° (preferably 180°±10°) or an odd multiple thereof, for particular incident wavelengths, and is thus especially useful for producing photomasks. Normally the film is deposited on a substrate. The substrate can be any mechanically stable material which is transparent to the wavelength of incident light used. Substrates such as quartz and fused silica (glass) are preferred for availability and cost.

The films of this invention are optically inhomogeneous, in that the extinction coefficient changes through the film thickness. The optically inhomogeneous attenuating film in accordance with the instant invention is typically in the form of a continuously varying structure ranging from optically metallic characteristics at the one surface (normally a substrate-film interface) to optically dielectric characteristics at the other surface (normally a film-air interface). The metallic component (e.g., Cr—N compounds) is characterized by an extinction coefficient within the range of 0 to 6 (preferably from 0.5 to 3.5) which generally decreases in magnitude with increasing photon energy for energy in the range from 1.5 to 6.5 eV, while the dielectric component (e.g., Cr—O compounds) is characterized by an extinction coefficient within the range of 0 to 2 (preferably from 0 to 1.5) which generally increases with increasing photon energy in the range from 1.5 to 6.5 eV. The refractive index of the metallic component is generally from 1 to 6, and is preferably from 2 to 5; and the refractive index of the dielectric component is generally from 1 to 3.5, and is preferably from 1.2 to 2.8. The metallic and dielectric components of the inhomogeneous attenuating film can be selected from materials such as transition, and non-transition, metal fluoro-oxy-carbo-nitrides. Materials which are particularly suited to the practice of this invention are metallic oxy-carbo-nitrides (i.e., M—O—C—N), metallic chloro-oxy-carbo-nitrides (i.e., M—Cl—O—C—N), metallic chloro-fluoro-oxy-carbo-nitrides (i.e., M—Cl—F—O—C—N) and metallic fluoro-oxy-carbonitrides (i.e., M—F—O—C—N) where M is selected from the group consisting of Cr, Fe, Mo, Zn, Co, Nb, Ta, W, Ti, Al, Mg, and Si. Cr is a preferred M; and chromium oxy-carbo-nitride is a preferred material based upon performance and availability.

The profile of the film's extinction coefficient changes gradually through the film thickness, and can vary in a smooth continuous manner or in a stepwise graded manner. For the purpose of this invention, the volume percent of the metallic and dielectric components for a given film are defined from the point in the film thickness where the extinction coefficient has a value equal to the average of the extinction coefficients of the two surfaces of the film. This "optical midpoint" position for the extinction coefficient in the film is considered for the purpose of this invention, the effective interface between the metallic and dielectric components, even though no abrupt interface of change in the extinction coefficient may exist at that location in the film thickness. Typically, other optical properties such as the index of refraction will also change gradually through the film thickness (see e.g., FIG. 3).

For the purpose of this invention, the optically inhomogeneous film must have a degree of transparency sufficient for the phase shift provided by the film to have the desired effect on the line width produced by the photomask. The maximum thickness of the film used in the photomask blank, $d_{max}$, may be estimated in terms of index of refraction of the dielectric component of the dielectric surface of the film, $n_{top}$, and the wavelength, $\lambda$, of light used, by:

$$d_{max} = \frac{(m\lambda)}{(2(n_{top} - 1))}$$

where m is an odd positive integer. In practice, m is typically equal to 1 or 3, but it is not limited to such, for example in the X-ray region. For a wavelength of 365 nanometers and $n_{top}$=1.5, $d_{max}$=365 m nanometers. The equation is valid for the films of this invention which are not essentially opaque (i.e., the transmission of the film remains above 0.001).

Based on this definition of the maximum thickness, the volumes of the metallic and dielectric components can vary in thickness from essentially 0 to a thickness defined by the requirement that these inhomogeneous attenuating films have sufficient transparency. Typically the metallic component is from 5 nanometers to 150 nanometers thick, and the dielectric component is from 10 nanometers to 400 nanometers thick.

An important feature of this invention is that the composition of the film can be designed in accordance with multiple requirements that the film have the 180° phase shift required by embedded phase shifters at the desired wavelength of light employed, and that the film have the desired transmission. The film design should also take into account the desired reflectivity for a particular application. Typically, desired reflectivities are within the range of from 0 to about 0.5.

Figure 2:
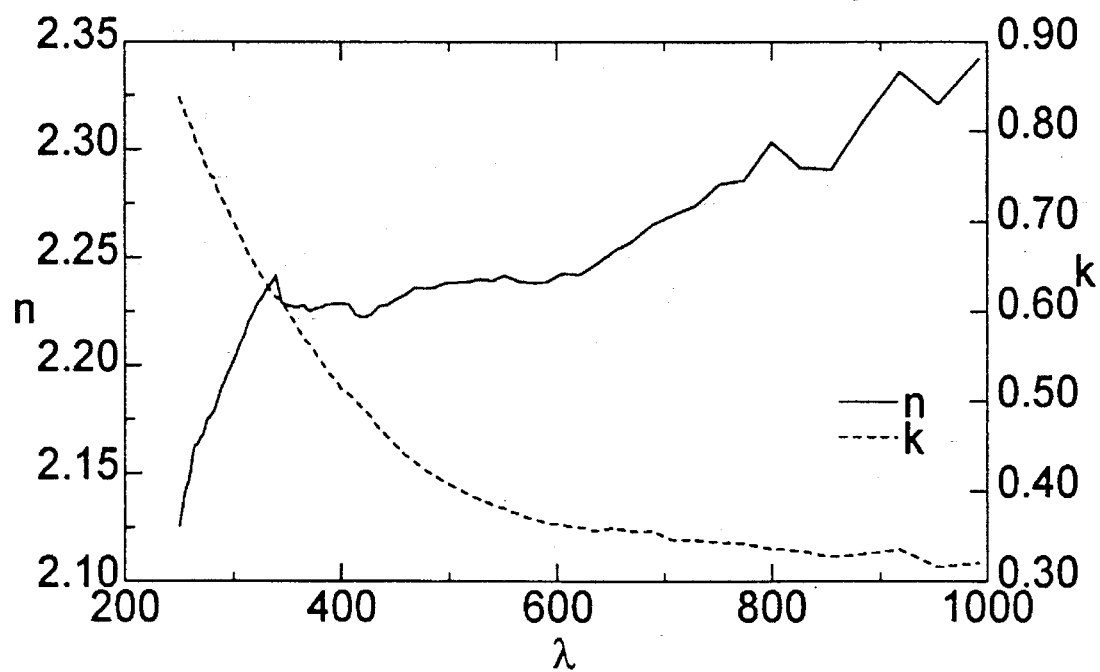
FIG. 2. Graph of the Index of Refraction (n) and Extinction Coefficient (k) as a function of wavelength ($\lambda$) in nanometers for a representative dielectric material.

For a particular pair of metallic and dielectric film components such as are shown in FIG. 1 and FIG. 2, a generalized design may be constructed with the metallic component at one film surface (e.g., adjacent to the substrate), and the dielectric component at the other film surface (e.g., adjacent to air) and a selected profile of gradual transition from metallic to dielectric as discussed above. Using the index of refraction and extinction coefficient for each of the two components, along with an estimated film thickness and a selected profile of change in optical properties, one may calculate the transmission, reflectivity, and phase shift for the film. One may use the well known matrix method (see O. S. Heavens, "Optical Properties of Thin Solid Films" Dover Publications, N.Y., 1965, pp 69–80 which is hereby incorporated herein by reference) for these calculations. Computers may be used to perform the numerical computations. For a given profile, optimization of the film design is accomplished by calculating transmission, reflectivity and phase shift combinations within manufacturable ranges, and determining which combinations provide the preferred solutions. Using computerized calculations based upon the matrix method, the profile may be modeled as a large number of thin homogeneous layers, and the characteristic matrices of all the layers are matrix multiplied to calculate the reflectivity, transmission and phase shift for the film. Predetermined optical property profiles might be used, such as linear, quadratic, cubic, exponential or gaussian. In practice the profile will be constrained by the particular equipment used to manufacture the films. The equipment will also normally determine the upper and lower limits for thicknesses of regions in the film structure.

Typically the attenuating films consist essentially of from 99% to 1% by volume (as defined above), preferably from 85% to 5% by volume metallic component, and from 1% to 99%, preferably from 15% to 95% dielectric component based upon the total volume of the attenuating film. Photomask blanks can be prepared by methods well known in the art. A photomask blank in accordance with this invention can generally be prepared by depositing a single inhomogeneous attenuating layer on a transparent substrate in a single pass, continuous deposition process. Conventional substrates may be used as such, or may be coated with a conductive and transparent film of a material such as indium oxide or stannic oxide.

The attenuating film may be deposited on a substrate by reactive sputter deposition. Reactive sputtering is a coating process that takes place in a vacuum chamber. Within the vacuum chamber is a sputter chamber filled with a gas mixture comprising inert gas and reactive gas under a predetermined pressure. A target comprising the material to be sputtered is positioned in the sputter chamber on an electrically conductive cathode. As a negative electrical potential is applied to the target, a plasma extending from the surface of the target is formed. The plasma comprises inert and reactive gas ions and species, and atomic units of the target. The atomic target units travel through the plasma to the substrate to be coated, and react with the reactive gas species to form various compositions. The compositions are deposited in a thin film or layer on each substrate as the substrate moves through the sputter chamber. Inert gases suitable for this process include argon, neon, krypton, and xenon. Suitable reactive gases include nitrogen, oxygen, methane and carbon dioxide. Pressure in the sputter chamber is usually in the range of $3.0 \times 10^{-2}$ to $1.0 \times 10^{-3}$ Torr. The target is typically chrome or a chrome-based material, such as chromium nitride, chromium carbide or chromium oxide. Further discussion of reactive sputter deposition for photomask blank production is provided in U.S. patent application Ser. No. 07/742,245, filed Aug. 8, 1991, which is hereby incorporated by reference.

The photomask blanks of this invention, having an inhomogeneous attenuating film, may be advantageously prepared using a reactive sputter deposition technique wherein substrates are continuously moved through a sputter chamber, by providing multiple targets (e.g., chrome-based targets) placed at intervals in the direction of movement of the substrates through the sputter chamber. By controlling the conditions within the sputter chamber (e.g., the electrical charges concurrently applied to each target, for example by direct current and/or radio frequency), the composition of the plasma over each target and the plasma overlap between targets can be adjusted to deposit onto the moving substrate a single attenuating layer having strata of different compositions and/or inter-strata transitional regions wherein the composition gradually changes from the composition of one stratum to the composition of the next resulting in an inhomogeneous attenuating layer.

This invention includes embodiments of transmissive EPS-PMBs which may be used with wavelengths within the range of 110 nm to 1000 nm.

Practice of the invention will become further apparent from the following non-limiting examples.

EXAMPLE 1

Two chromium targets were positioned in a commercially available direct current planar magnetron sputtering device. Each target was about six inches wide, twenty inches long and 0.25 inches high. The edge-to-edge distance between targets was about five inches. The sputter chamber was filled with a gas comprising argon, nitrogen, oxygen, carbon dioxide and methane. A polished glass substrate was moved through the sputter chamber under the conditions set forth in Table 1.

TABLE

| | |
|---|---|
| Operating Pressure | $2.8 \times 10^{-3}$ Torr |
| Substrate Travel Speed | 240 mm/min. |
| DC Elec. Power Target #1 | 1.4 KW |
| DC Elec. Power Target #2 | 0.85 KW |
| Ar | 90 sccm |
| $O_2$ | 3.6 sccm |
| $N_2$ | 24 sccm |
| $CH_4$ | 3.5 sccm |
| $CO_2$ | 7.5 sccm |

Under these operating conditions, due to the light emission from the different species in the two different plasmas and the plasma overlap region, a color spectrum from bright blue over the first target changing to a bright pink over the second target was observed with the naked eye through windows provided on the side of the process chamber, confirming the existence of compositional gradient within the plasma in the direction of substrate movement.

Figure 3:
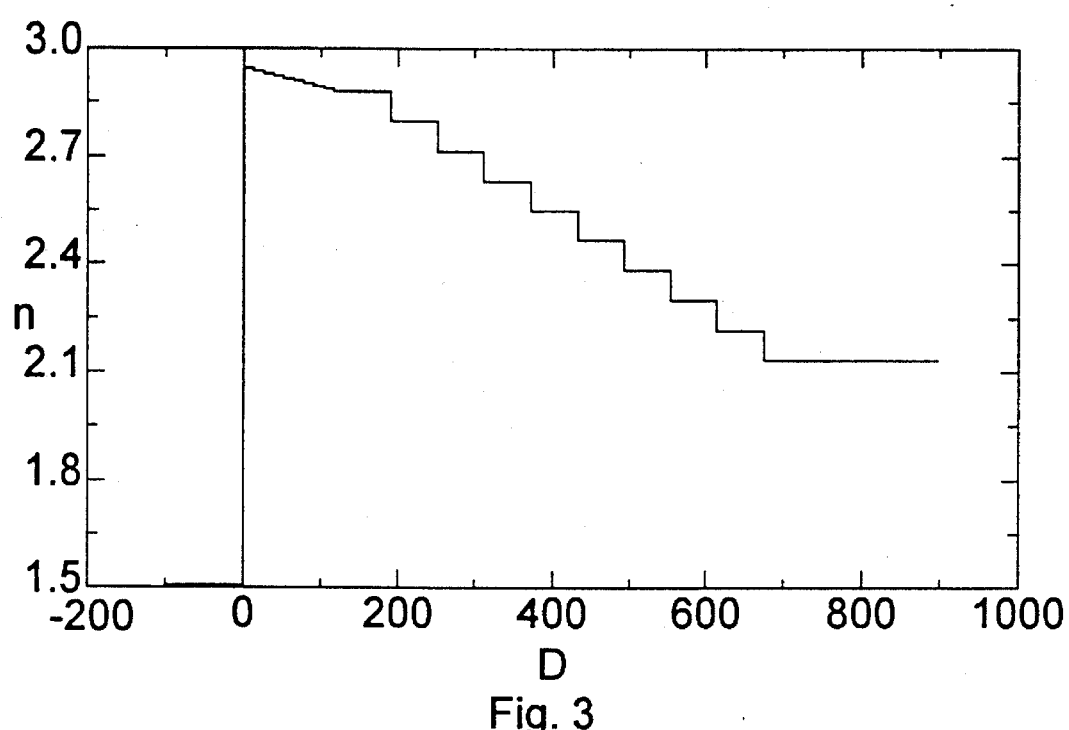
FIG. 3. Graph of a depth wise profile of the index of refraction (n) as a function of distance from substrate surface (D) in Angstroms for a graded embedded phase shifter-photomask blank for 253 nm wavelength.

The substrates removed from the chamber had a film coating of about 87 nanometers, as determined by stylus profilometry. The optical reflectivity and transmission, as well as the ellipsometric spectra of the air-film and substrate-film surfaces, were measured. Using these spectroscopic measurements, the optical properties such as the index of refraction and the extinction coefficients at the air-film surface and the substrate-film surface, and also the profile of these optical properties was modeled using the matrix method described herein. The optical properties calculated for the material at the substrate-film surface are shown in FIG. 1 and are of a metallic nature as defined above, while the optical properties calculated for the material at the film-air surface are shown in FIG. 2 and have a dielectric nature as defined above. One estimated profile of the index of refraction, which is consistent with FIG. 1 and FIG. 2 and the measured optical and ellipsometric data was determined using the matrix method and is shown in FIG. 3. While other profiles might also be consistent, the measured optical and ellipsometric data cannot be interpreted assuming a film with homogeneous properties.

Figure 4:
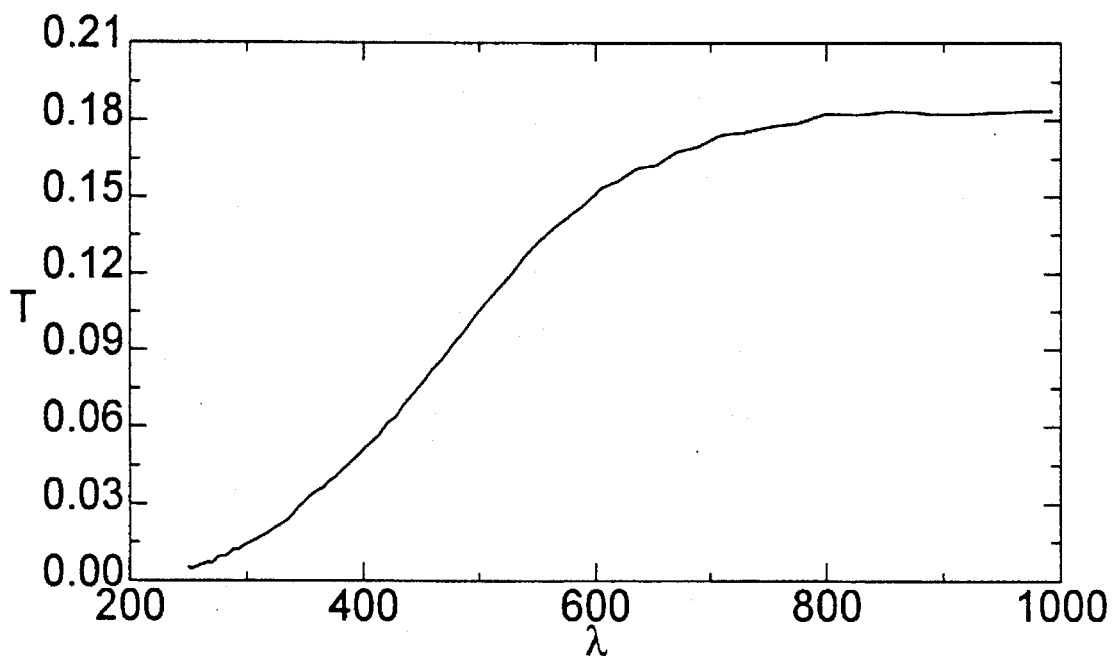
FIG. 4. Graph of the optical transmission (T) as a function of wavelength ($\lambda$) in nanometers for an embedded phase shifter-photomask blank for use at 253 nm.
Figure 5:
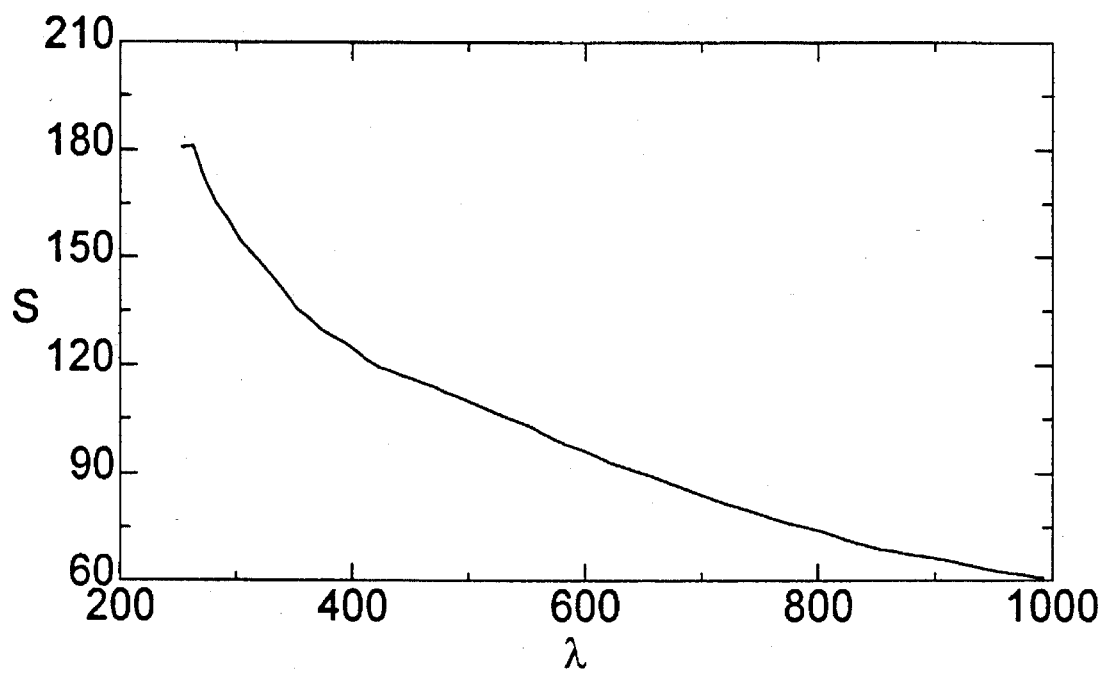
FIG. 5. Graph of the transmitted phase shift (S) as a function of wavelength ($\lambda$) in nanometers for an embedded phase-shifter photomask blank for use at 253 nm.

The transmission of the photomask blank produced is shown in FIG. 4, where the transmission of the film is about 0.005 at a wavelength of 253 nm. At this wavelength the phase shift of the transmitted light as determined by the matrix method is about 180° as illustrated in FIG. 5. The reflectivity of this film was measured as about 0.19 at 253 nm. This photomask blank therefore is considered an embedded phase shifter photomask blank for use at 253 nm.

EXAMPLE 2

Figure 6:
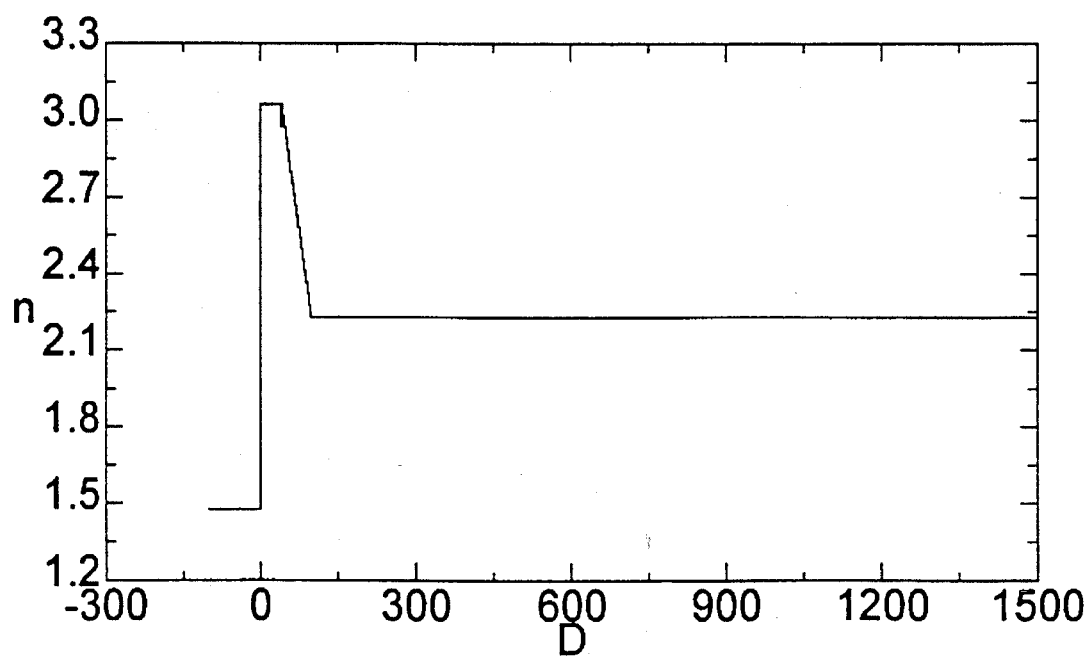
FIG. 6. Graph of a depth wise profile of the index of refraction (n) as a function of distance from substrate surface (D) in Angstroms for an embedded phase shifter-photomask blank for use at a wavelength of 365 nm.

A EPS-PMB is designed for use at 365 nm. Using the metallic and dielectric components shown in FIG. 1 and FIG. 2, respectively, a profile suitable for an EPS-PMB with a transmission of 0.027, a reflectivity of about 0.16 and 180° phase shift at 365 nm is shown in FIG. 6.

EXAMPLE 3

Figure 7:
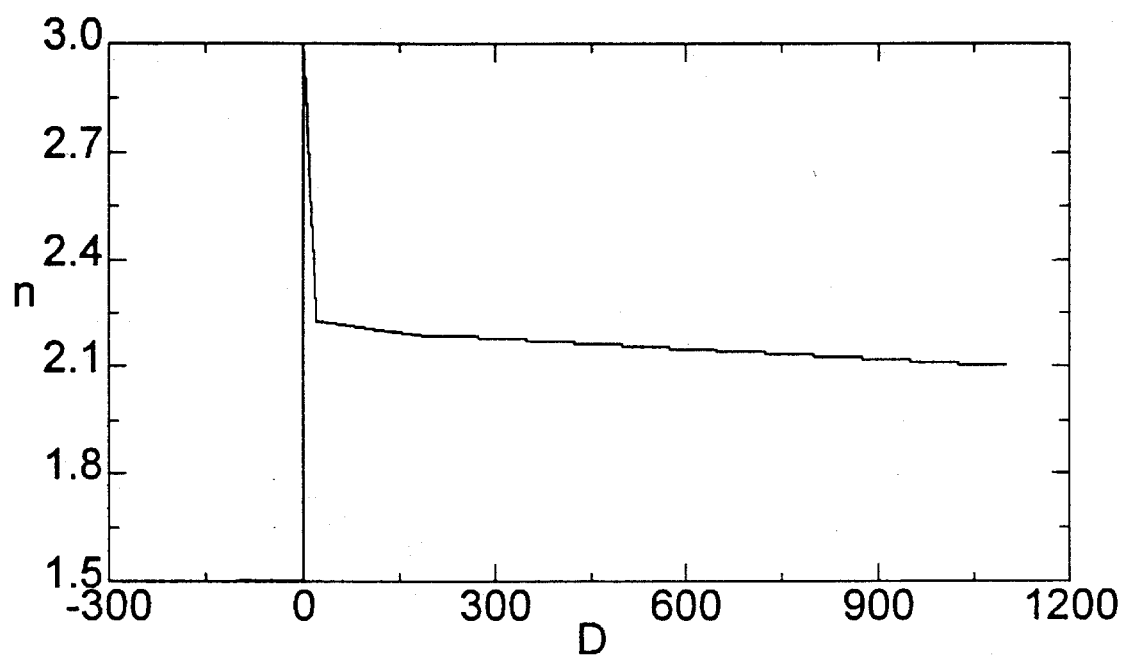
FIG. 7. Graph of a depth wise profile of the index of refraction (n) as a function of distance from substrate surface (D) in Angstroms for an embedded phase shifter-photomask blank for use at a wavelength of 257 nm.

A EPS-PMB is designed for use at 257 nm. Using the metallic and dielectric components shown in FIG. 1 and FIG. 2, respectively, a profile suitable for an EPS-PMB with a transmission of 0.01, a reflectivity of about 0.175 and 173° phase shift at 257 nm is shown in FIG. 7

Example 2 and Example 3 demonstrate the inherent advantages of the inhomogeneous nature of these films and the versatility of the metallic and dielectric components of the inhomogeneous attenuating films.

Particular embodiments of the invention are illustrated in the examples. Other embodiments will become apparent to those skilled in the art from a consideration of the specification or practice of the invention disclosed herein. It is understood that modifications and variations may be practiced without departing from the spirit and scope of the novel concepts of this invention. It is further understood that the invention is not confined to the particular formulations and examples herein illustrated, but it embraces such modified forms thereof as come within the scope of the following claims.

What is claimed is:

1. A transmissive embedded phase shifter-photomask blank for a selected wavelength comprising an optically inhomogeneous attenuating film having a transmission of at least 0.001 and consisting essentially of a combination of a metallic component and a dielectric component; wherein one surface of the film has a higher content of metallic component than the other surface, and the profile of change in the extinction coefficient is gradual through the film thickness; and wherein said profile of change and the film thickness are selected to provide a phase shift of about 180°, or an odd multiple thereof, at the selected wavelength.

2. The transmissive embedded phase shifter-photomask blank of claim 1 wherein the phase shift is about 180°.

3. The transmissive embedded phase shifter-photomask blank of claim 2 wherein the reflectivity is within the range of from 0 to 0.5.

4. The transmissive embedded phase shifter-photomask blank of claim 3 wherein the metallic component is from 85% to 5% of the film by volume and wherein the dielectric component is from 15% to 95% of the film by volume.

5. The transmissive embedded phase shifter-photomask blank of claim 1, claim 2, claim 3, or claim 4 wherein the selected wavelength is from 110 nm to 1000 nm.

6. The transmissive embedded phase shifter-photomask blank of claim 5 wherein the metallic component and dielectric component are M—O—C—N materials, M—Cl—O—C—N materials, M—Cl—F—O—C—N materials or M—F—O—C—N materials where M is selected from the group consisting of Cr, Fe, Mo, Zn, Co, Nb, Ta, W, Ti, Al, Mg, and Si.

7. The transmissive embedded phase shifter-photomask blank of claim 6 wherein M is Cr.

8. The transmissive embedded phase shifter-photomask blank of claim 7 wherein the metallic component and dielectric component are Cr-0-C—N materials.

\* \* \* \* \*